(12) United States Patent
Takebayashi et al.

(10) Patent No.: US 12,284,729 B2
(45) Date of Patent: Apr. 22, 2025

(54) CERAMIC HEATER WITH SHAFT

(71) Applicant: NGK INSULATORS, LTD., Nagoya (JP)

(72) Inventors: Hiroshi Takebayashi, Handa (JP); Kenichiro Aikawa, Handa (JP); Tatsuya Kuno, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 781 days.

(21) Appl. No.: 17/451,915

(22) Filed: Oct. 22, 2021

(65) Prior Publication Data

US 2022/0046762 A1 Feb. 10, 2022

Related U.S. Application Data

(63) Continuation of application No. PCT/JP2020/022834, filed on Jun. 10, 2020.

(30) Foreign Application Priority Data

Jul. 16, 2019 (JP) .................. 2019-130905

(51) Int. Cl.
*H05B 3/06* (2006.01)
*H01J 37/32* (2006.01)
(Continued)

(52) U.S. Cl.
CPC .......... *H05B 3/06* (2013.01); *H01J 37/32724* (2013.01); *H01L 21/68792* (2013.01);
(Continued)

(58) Field of Classification Search
CPC .... H05B 3/06; H05B 3/283; H05B 2203/005; H05B 2203/016; H05B 2203/017; H01L 21/68792; H01J 37/32724
See application file for complete search history.

(56) References Cited

U.S. PATENT DOCUMENTS

2004/0173161 A1 9/2004 Mariner et al.
2007/0138601 A1* 6/2007 Fan .................. H01L 21/67103
257/632
(Continued)

FOREIGN PATENT DOCUMENTS

CN 101026119 A 8/2007
JP 2006-517740 A 7/2006
(Continued)

OTHER PUBLICATIONS

Chinese Office Action (Application No. 202080050721.7) dated Feb. 8, 2024 (with English translation) (12 pages).

(Continued)

*Primary Examiner* — Brian W Jennison
(74) *Attorney, Agent, or Firm* — BURR PATENT LAW, PLLC

(57) ABSTRACT

A ceramic heater with a shaft includes: a ceramic plate in which resistance heating element is embedded; a hollow ceramic shaft bonded to the surface on an opposite side of a wafer placement surface of the ceramic plate; a conductive film provided in an axial direction to extend on the internal circumferential surface of the ceramic shaft; a recessed section provided to reach a terminal of the resistance heating element from the surface on the opposite side of the wafer placement surface of the ceramic plate, the recessed section having a bottom surface to which a lower surface of the terminal is exposed and a lateral surface to which a surface of the conductive film is exposed; and a connection member which is filled in the recessed section, and electrically connects the lower surface of the terminal and the surface of the conductive film.

6 Claims, 4 Drawing Sheets

(51) Int. Cl.
*H01L 21/687* (2006.01)
*H05B 3/28* (2006.01)

(52) U.S. Cl.
CPC ....... *H05B 3/283* (2013.01); *H05B 2203/005* (2013.01); *H05B 2203/016* (2013.01); *H05B 2203/017* (2013.01)

(56) References Cited

U.S. PATENT DOCUMENTS

2015/0076135 A1    3/2015  Merry et al.
2018/0204754 A1*   7/2018  Tokusho ........... H01L 21/68792

FOREIGN PATENT DOCUMENTS

| JP | 2007-173828 A | 7/2007 |
| JP | 2016-536803 A | 11/2016 |
| JP | 2017-162878 A | 9/2017 |
| KR | 10-2007-0066899 A | 6/2007 |
| KR | 10-2018-0008740 A | 1/2018 |

OTHER PUBLICATIONS

International Search Report and Written Opinion (Application No. PCT/JP2020/022834) dated Jul. 21, 2020 (with English translation).
English translation of the International Preliminary Report on Patentability (Chapter I) dated Jan. 27, 2022 (Application No. PCT/JP2020/022834).
Korean Office Action (with English translation) dated Jun. 15, 2023 (Application No. 10-2021-7037422).

* cited by examiner

CERAMIC HEATER WITH SHAFT

BACKGROUND OF THE INVENTION

1. Field of the Invention

The present invention relates to a ceramic heater with a shaft.

2. Description of the Related Art

A ceramic heater with a shaft, which holds a wafer, has been conventionally used in transfer, exposure, a film formation process such as CVD, cleaning, etching, and microfabrication such as dicing, for a semiconductor wafer. As shown in PTL 1, such a ceramic heater with a shaft is disclosed, which includes: a ceramic plate in which resistance heating elements are embedded; a hollow ceramic shaft bonded to the surface on the opposite side of a wafer placement surface of the ceramic plate; conductive films formed to extend along the internal circumferential wall surface of the ceramic shaft in a vertical direction; and wires that electrically connect the resistance heating elements and the conductive films (see FIG. 5).

CITATION LIST

Patent Literature

PTL 1: JP 2017-162878 A

SUMMARY OF THE INVENTION

However, since the resistance heating elements and the conductive films are connected by wires, the reliability of electrical connection between the resistance heating elements and the conductive films has been low. Specifically, at the time of manufacturing and at the time of use, a wire connecting a resistance heating element and a conductive film may come off.

The present invention has been devised to solve such a problem, and it is a main object to increase the reliability of electrical connection between the resistance heating element and the conductive film.

A ceramic heater with a shaft of the present invention includes: a ceramic plate in which resistance heating element is embedded; a hollow ceramic shaft bonded to a surface on an opposite side of a wafer placement surface of the ceramic plate; a conductive film provided in an axial direction to extend on an internal circumferential surface of the ceramic shaft; a recessed section provided to reach a terminal of the resistance heating element from the surface on the opposite side of the wafer placement surface of the ceramic plate, the recessed section having a bottom surface to which a lower surface of the terminal is exposed and a lateral surface to which a surface of the conductive film is exposed; and a connection member which is filled in the recessed section, and electrically connects the lower surface of the terminal and the surface of the conductive film.

In the ceramic heater with the shaft, the connection member is filled in the recessed section. The lower surface of the terminal is exposed to the bottom surface of the recessed section, and the surface of the conductive film is exposed to the lateral surface of the recessed section. The connection member is in surface contact with the lower surface of the terminal of the resistance heating element, and in surface contact with the surface of the conductive film. Therefore, as compared with when the terminal of the resistance heating element and the conductive film is connected by wire, the reliability of electrical connection between the resistance heating element and the conductive film is increased.

In the ceramic heater with the shaft of the present invention, the ceramic plate may have multiple zones, each of the multiple zones may be provided with the resistance heating element, the resistance heating element may be provided with two of the terminals independently, and the resistance heating element may be provided with two of the conductive films independently. When rods for supplying power to the resistance heating elements are placed in the inner space of the ceramic shaft, the number of the rods is limited, and accordingly, the number of the resistance heating elements is also limited. However, the conductive film is used instead of the rod herein, thus it is possible to cope with more resistance heating elements.

In the ceramic heater with the shaft of the present invention, the conductive film and the connection member may be covered with an insulating film. In this manner, it is possible to prevent a short-circuit caused by contact between the conductive film or the connection member and another metal member or the like. It is preferable that such an insulating film be an aerosol deposition (AD) film or a thermal spray film.

DETAILED DESCRIPTION OF THE INVENTION

Figure 1:
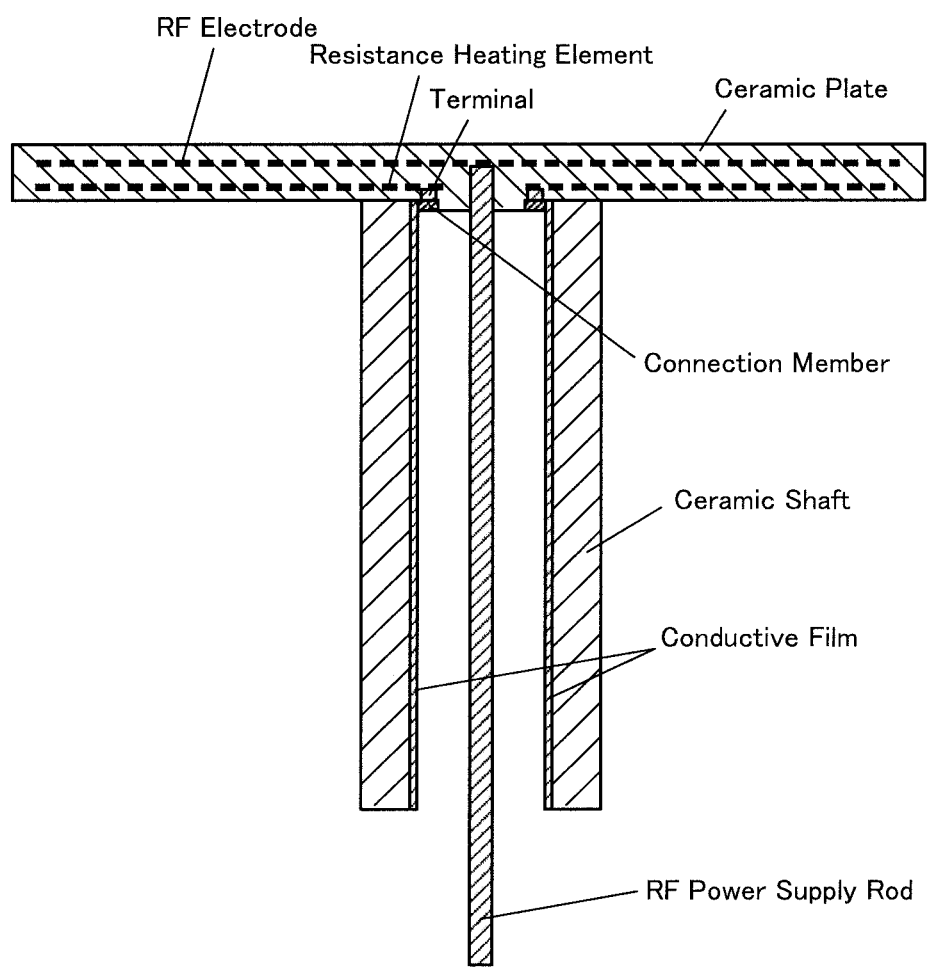
FIG. 1 is a vertical cross-sectional view of a ceramic heater with a shaft of the present embodiment.

A preferred embodiment of the present invention will be described below with reference to the drawings. FIG. 1 is a vertical cross-sectional view of a ceramic heater with a shaft of the present embodiment.

Figure 2:
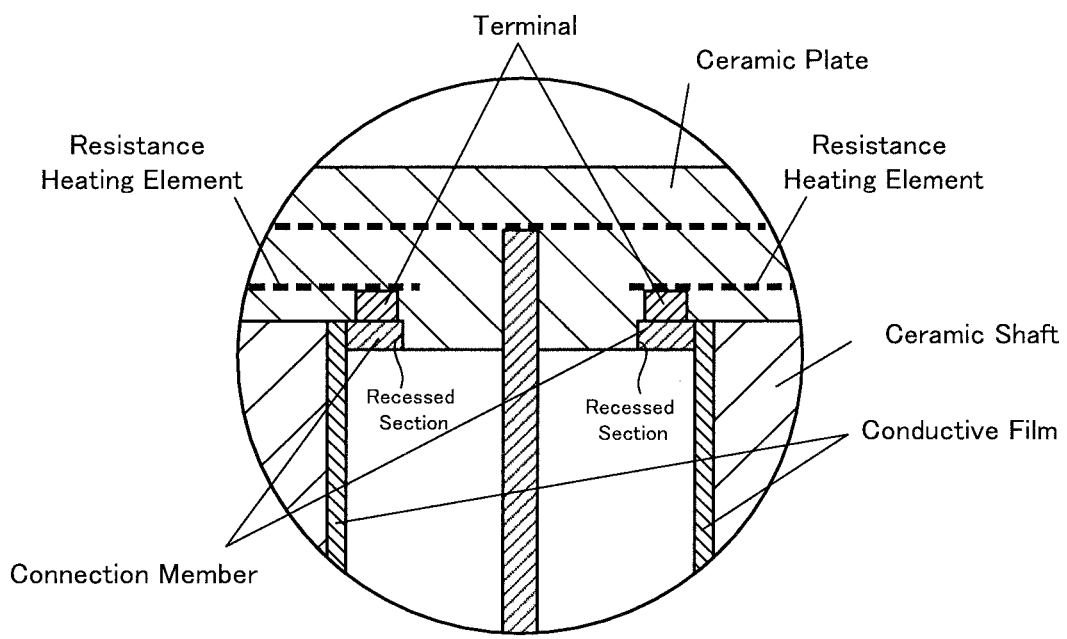
FIG. 2 is a partial enlarged view of FIG. 1.
Figure 3:
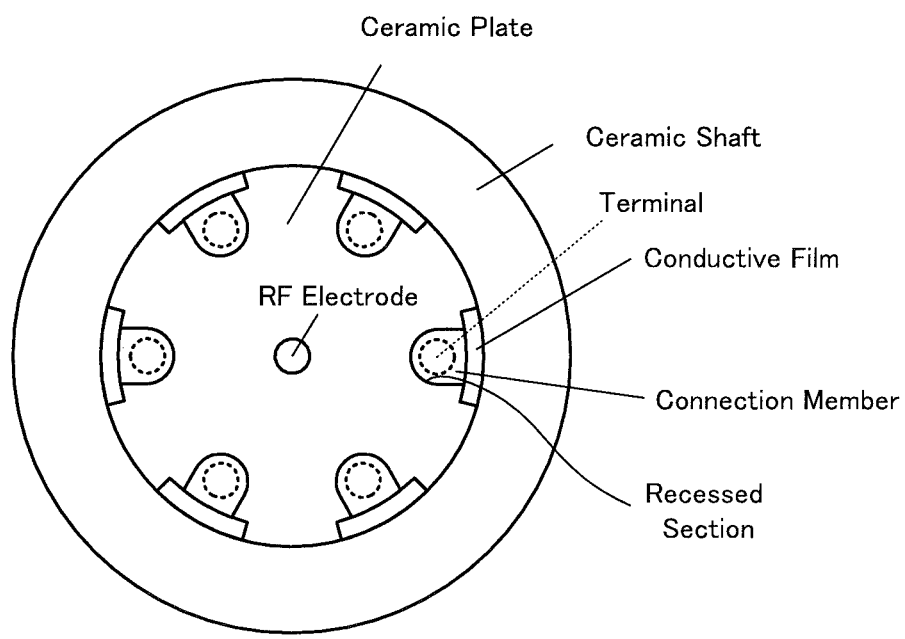
FIG. 3 is a bottom view of the ceramic heater with the shaft.

As illustrated in FIG. 1, the ceramic heater with the shaft includes: a ceramic plate, a ceramic shaft, conductive films, recessed sections (see FIG. 2), and connection members. An RF electrode and resistance heating elements are embedded in the ceramic plate. The RF electrode is an electrode to which a high-frequency voltage is applied when plasma is generated. An RF power supply rod is housed in the inner space of the ceramic shaft, and bonded to the RF electrode from the surface on the opposite side of a wafer placement surface of the ceramic plate. The resistance heating elements heat the ceramic plate when they are energized. In the present embodiment, multiple (three) zones of the ceramic plate are provided with the resistance heating elements, respectively. Each of the resistance heating elements is provided with two of the terminals independently. The ceramic shaft is a hollow shaft which is bonded to the surface on the opposite side of the wafer placement surface of the ceramic plate by direct bonding. The conductive films are provided in an axial direction (vertical direction) so as to extend on the internal circumferential surface of the ceramic shaft. The conductive films may be formed by printing or plating, or formed by an AD method, a thermal spray method, a CVD method, or a PVD method. Each of the resistance heating elements is provided with two of the conductive films. The recessed sections are U-shaped grooves (see FIG. 3) which are each provided to reach a terminal of the resistance heating element from the surface on the opposite side of the wafer placement surface of the ceramic plate. The lower surface of the terminal is exposed to the bottom surface of each recessed section. The surface of the conductive film is exposed to the lateral surface of each recessed section. Each connection member is filled in the recessed section, and electrically connects the lower surface of the terminal of the resistance heating element, and the surface of the conductive film. The connection member is obtained by melting brazing material placed in the recessed section, then solidifying the brazing material.

In the ceramic heater with the shaft of the present embodiment described above, each connection member is filled in the recessed section. The lower surface of the terminal is exposed to the bottom surface of each recessed section, and the surface of the conductive film is exposed to the lateral surface of each recessed section. Each connection member is in surface contact with the lower surface of the terminal of the resistance heating element, and in surface contact with the surface of the conductive film. Therefore, as compared with when the terminals of the resistance heating elements and the conductive films are connected by wires, the reliability of electrical connection between the resistance heating elements and the conductive films is increased.

When rods for supplying power to the resistance heating elements are placed in the inner space of the ceramic shaft, the number of the rods is limited, and accordingly, the number of the resistance heating elements is also limited. However, the conductive film is used instead of the rod herein, thus it is possible to cope with more resistance heating elements.

Note that the present invention is not particularly limited to the above-described embodiment, and it goes without saying that the present invention can be implemented in various modes as long as it belongs to the technical scope of the invention.

Figure 4:
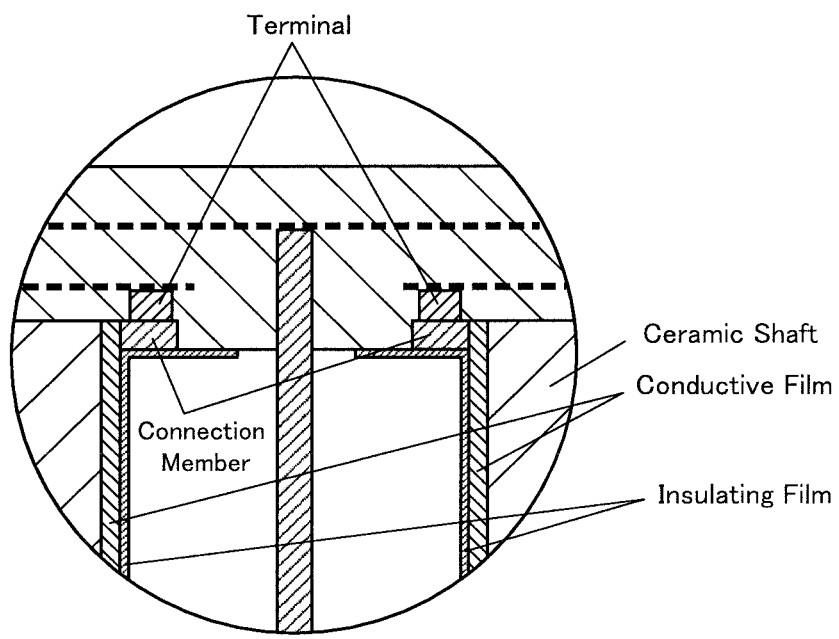
FIG. 4 is a partial enlarged view of another embodiment.
Figure 5:
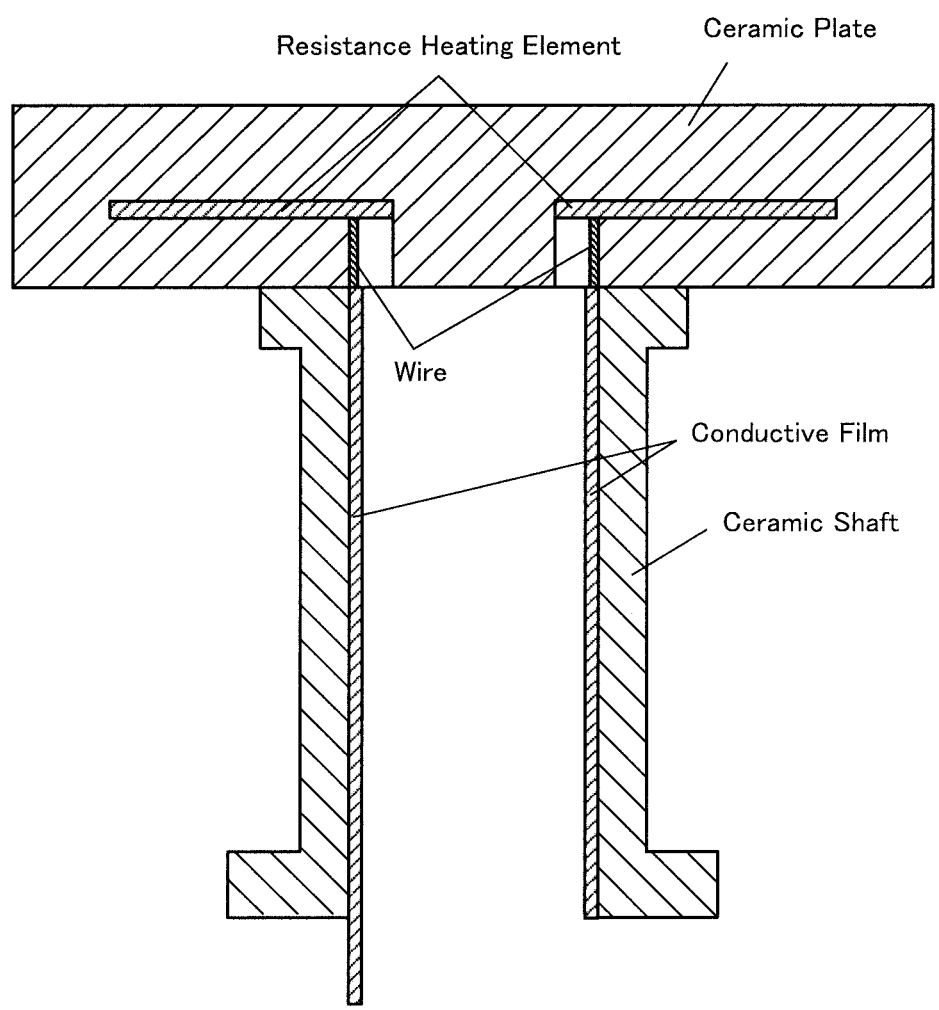
FIG. 5 is a vertical cross-sectional view of a conventional ceramic heater with a shaft.

In the embodiment described above, as shown in FIG. 4, the surfaces of the conductive films and the connection members may be covered with an insulating film. In this manner, it is possible to prevent a short-circuit caused by contact of the conductive film or the connection member with another metal member or the like. It is preferable that the insulating film be an aerosol deposition (AD) film or a thermal spray film. Particularly, an AD method (including a plasma AD method) is suitable for forming a thin film of fine ceramic particles with high accuracy. In addition, the AD method allows a film of ceramic particles to be formed by an impact consolidation phenomenon, thus it is not necessary to sinter ceramic particles at a high temperature.

In the above-described embodiment, an electrostatic electrode may be embedded in the ceramic plate.

The present application claims priority from Japanese Patent Application No. 2019-130905, filed on Jul. 16, 2019, the entire contents of which are incorporated herein by reference.

What is claimed is:

1. A ceramic heater with a shaft, comprising:
a ceramic plate in which resistance heating element is embedded;
a hollow ceramic shaft bonded to a surface on an opposite side of a wafer placement surface of the ceramic plate;
a conductive film provided in an axial direction to extend on an internal circumferential surface of the ceramic shaft;
a recessed section comprising U-shaped grooves provided to reach a terminal of the resistance heating element from the surface on the opposite side of the wafer placement surface of the ceramic plate, the recessed section having a bottom surface to which a lower surface of the terminal is exposed and a lateral surface to which a surface of the conductive film is exposed; and
a connection member which is filled in the recessed section, and electrically connects the lower surface of the terminal and the surface of the conductive film.

2. The ceramic heater with a shaft according to claim 1, wherein the ceramic plate has multiple zones, each of the multiple zones is provided with the resistance heating element, the resistance heating element is independently provided with two terminals, and
the resistance heating element is independently provided with two conductive films.

3. The ceramic heater with a shaft according to claim 1, wherein the conductive film and the connection member is covered with an insulating film.

4. The ceramic heater with a shaft according to claim 3, wherein the insulating film is an aerosol deposition film or a thermal spray film.

5. The ceramic heater with a shaft according to claim 4, wherein the insulating film is an aerosol deposition film.

6. The ceramic heater with a shaft according to claim 1, wherein the recessed section of the ceramic plate is positioned within an inside diameter of the hollow ceramic shaft.

* * * * *